United States Patent [19]

Osawa

[11] Patent Number: 5,113,089
[45] Date of Patent: May 12, 1992

[54] CURRENT SENSING CIRCUIT
[75] Inventor: Yasuo Osawa, Kanagawa, Japan
[73] Assignee: Kabushiki Kaisha Toshiba, Kanagawa, Japan
[21] Appl. No.: 574,098
[22] Filed: Aug. 29, 1990
[30] Foreign Application Priority Data
  Sep. 20, 1989 [JP] Japan .................. 1-242024
[51] Int. Cl.[5] .................. H03K 5/153; H03K 5/24; H03K 17/08; H03K 17/18
[52] U.S. Cl. .................. 307/350; 307/362; 307/571; 323/316
[58] Field of Search .............. 307/350, 362, 571, 584; 361/91, 93, 100; 323/284, 315, 316

[56] References Cited
U.S. PATENT DOCUMENTS

| | | |
|---|---|---|
| 4,518,869 | 5/1985 | Herold .................. 307/350 |
| 4,553,084 | 11/1985 | Wrathall . |
| 4,672,238 | 6/1987 | Nemoto .................. 307/350 |
| 4,686,383 | 8/1987 | Croft . |
| 4,820,968 | 4/1989 | Wrathall . |
| 4,827,207 | 5/1989 | Chieli . |

FOREIGN PATENT DOCUMENTS 0133789  3/1985  European Pat. Off. .
0274995  7/1988  European Pat. Off. .
2059695  4/1981  United Kingdom .

OTHER PUBLICATIONS

EDN 1986 "Sense-cell MOSFET eliminates losses in source circuit", Warren Schultz: June. 26, 1986.

Primary Examiner—John Zazworsky
Attorney, Agent, or Firm—Finnegan, Henderson, Farabow, Garrett and Dunner

[57] ABSTRACT

A sensing circuit is disclosed wherein a first MOS transistor is connected in series with a load to produce a source to drain voltage in response to the load current. A reference voltage generating circuit includes a second MOS transistor and provides a reference voltage determined by the source-to-drain voltage of the second MOS transistor in response to a constant current supplied thereto. A comparator circuit compares the source to drain voltage of the first MOS transistor with the reference voltage to sense the load current.

5 Claims, 3 Drawing Sheets

CURRENT SENSING CIRCUIT

BACKGROUND OF THE INVENTION

1. Field of the Invention

This invention concerns a current sensing circuit using FET (Field Effect Transistor). More particularly, this invention concerns a current sensing circuit which is used as an over current sensing circuit in a power circuit.

2. Description of the Prior Art

It is often desirable to sense a load current in order to either control that current or to prevent it from exceeding certain bounds. Conventionally, a current sensing circuit which includes a resistor connected in series with the load is often used. In this circuit, the load current is sensed by sensing the voltage drop at the resistor. However, by inserting a resistor in a high current path, the power consumption is increased.

Thus, to reduce the power consumption, a current sensing circuit using a main FET and a sense FET is disclosed in U.S. Pat. No. 4,553,084.

FIG. 1 shows a circuit diagram of the current sensing circuit disclosed in the United States Patent. In the current sensing circuit, a main FET 1, having an input drive circuit 3 is connected in series with a load 4 between a first power source terminal 6 and a second power source terminal 7. A sense FET 2 is connected in parallel with the main FET 1. This connection allows a second current path for part of the load current which flows through the load 4. A comparator 8 compares the voltage drop at a resistor 5 with a reference voltage supplied to a terminal 9, and produces an output signal from an output terminal 10 in accordance with the comparison result.

In this circuit, a small resistance is required for the sense resistor 5 to keep good linearity of the current which flows through resistor 5 with respect to the load current. Namely, the accuracy of the resistor 5 determines the accuracy of the sensing. However, it is not so easy to provide a resistor with an accurate but small resistance value.

SUMMARY OF THE INVENTION

Therefore, an object of the present invention is to provide a sensing circuit which has a low power consumption and a high sensing accuracy.

To achieve the object, this invention provides a current sensing circuit for sensing a load current flowing through a load, comprising: a first MOS transistor having a source to drain path connected in series with said load and having a gate electrode, said first MOS transistor producing a source to drain voltage in response to the load current; an input terminal supplied with an input signal; reference voltage generating means including a second MOS transistor and a constant current source connected to the second MOS transistor, for generating a reference voltage; delay means for supplying a delayed input signal to the gate electrode of the second MOS transistor; first circuit means for producing an output voltage which is proportional to the source to drain voltage of the first MOS transistor; and comparing means for comparing the output voltage of the first circuit means with the reference voltage.

BRIEF DESCRIPTION OF THE DRAWINGS

The accompanying drawings, which are incorporated in and constitute a part of the specification, illustrate an embodiment of the invention, and, together with the description, serve to explain the principles of the invention. Referring now to the drawings, like reference characters designate like or corresponding parts throughout the several views. In the drawings.

DETAILED DESCRIPTION OF THE INVENTION

Figure 1:
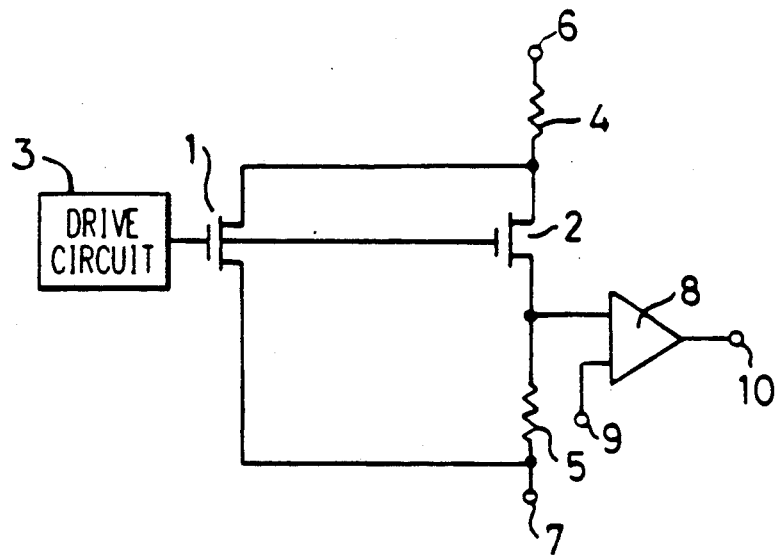
FIG. 1 is a circuit diagram of a conventional sensing circuit.
Figure 2:
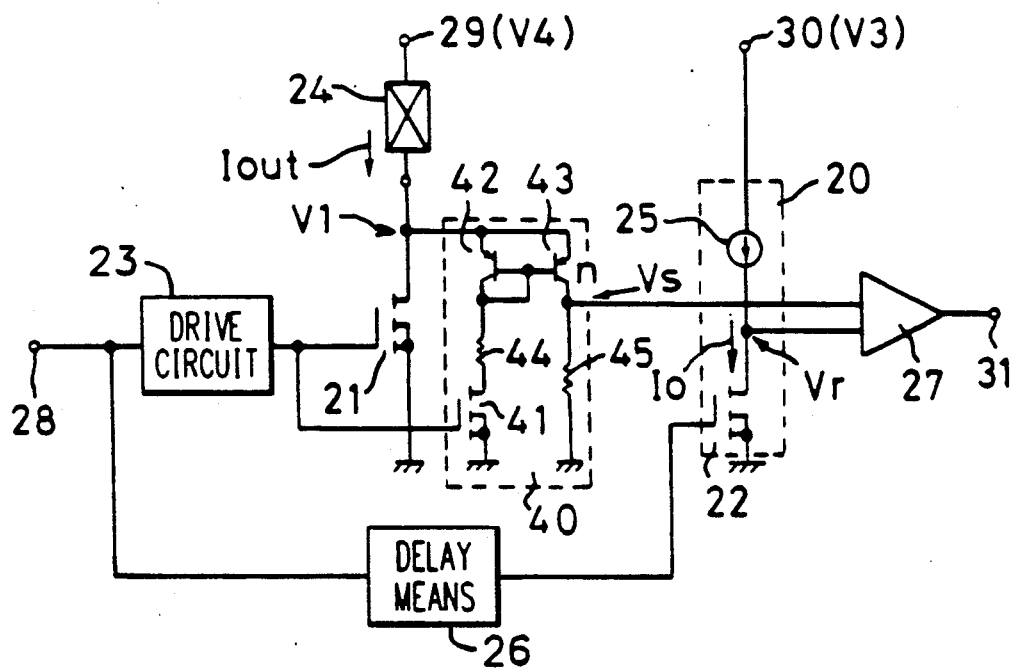
FIG. 2 is a circuit diagram of a first embodiment of the present invention.

Referring now to the drawings, the present invention will be explained. FIG. 2 is a circuit diagram of a first embodiment of the present invention. In the drawing, numerals 29 and 30 designate power source terminals, and numeral 28 designates an input terminal.

In this embodiment, there is provided a first MOS transistor 21. The source to drain path of the MOS transistor 21 is connected in series with a load 24.

Numeral 23 designates a drive circuit, e.g., composed of CMOS circuits, which provides a drive signal to the gate electrode of the first MOS transistor 21 in response to an input signal supplied to the input terminal 28.

Furthermore, in the present embodiment, there is provided a reference voltage generating means 20. The reference voltage generating means 20 comprises a second MOS transistor 22 and a constant current source 25. The constant current source 25 provides a predetermined current Io to the MOS transistor 22 responsive to a power source voltage supplied to the power source terminal 30.

The present embodiment is further provided with delay means 26, e.g., composed of a conventional CR circuit. The delay means 26 supplies a delayed input signal to the gate electrode of the second MOS transistor 22.

Furthermore, the embodiment is provided with first circuit means 40. The first circuit means 40 includes bipolar transistors 42 and 43, and resistors 44 and 45. The first circuit means 40 further includes a MOS transistor 41. The emitter electrodes of the transistors 42 and 43 are connected to the drain electrode of the first MOS transistor 21, and the base electrodes thereof are connected in common. The collector electrodes of the transistors 42 and 43 are connected to the resistors 44 and 45, respectively. In this way, the transistors 42 and 43 form a current mirror circuit. The emitter area ratio between the transistors 42 and 43 is n (n is larger than 1).

The gate electrode of the MOS transistor 41 is connected to the gate electrode of the first MOS transistor 21, and the drain electrode thereof is connected to the resistor 44.

The present embodiment is still further provided a comparing means 27, e.g., composed of a comparator circuit. The comparing means 27 includes first and second input terminals, and the first input terminal is connected to the collector electrode of the transistor 43 and the other is connected to the drain electrode of the transistor 22 to receive the reference voltage Vr.

Figure 3:
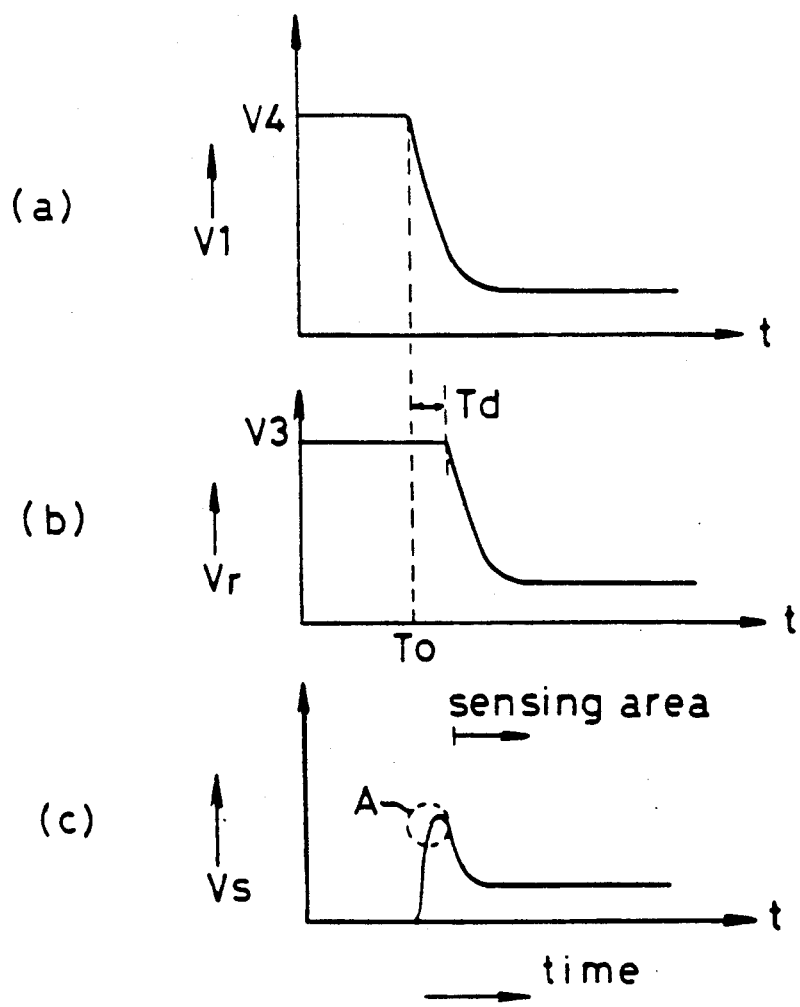
FIG. 3 is a timing chart to explain the operation of the circuit in FIG. 2.

The operation of the sensing circuit will be explained using a timing chart illustrated in FIG. 3. In this sensing circuit, when an input signal (not shown) is supplied to the input terminal 28 at timing To, the drive circuit 23 provides a drive signal to the gate electrodes of the MOS transistor 21 and 41. In response to the drive signal, the transistors 21 and 41 are switched to the ON state. Assuming that the emitter to collector voltage of transistor 43 is negligible, the collector voltage Vs of transistor 43 is substantially equal to the drain voltage V1 of the MOS transistor 21. Thus, the source to drain voltage of the transistor 21 is transferred, and is supplied to the comparing means 27.

In this embodiment, the load current Iout is sensed by comparing the voltage Vs with the reference voltage Vr. Namely, for example, when the voltage Vs is higher than the reference voltage Vr, the comparing means 27 produces a high level output signal, and when the voltage Vs is lower than the reference voltage Vr, produces a low level output signal. Therefore, by discriminating whether the output of the comparating means 27 is high level or low level, it can be sensed whether the load current Iout is greater than the predetermined current Io, or within an allowed operating area.

The constant current Io can be set arbitrarily to determine a predetermined load current limit, and the relationship between the load current Iout and the constant current Io is explained as follows.

$$Iout \cdot R1 = Io \cdot R2 \quad (1)$$

$$Iout = (R2/R1) \cdot Io \quad (2)$$

wherein R1 is a ON resistance of the transistor 21 and R2 is the ON resistance of the transistor 22.

According to the present invention, the source to drain voltage of the first MOS transistor 21 is compared with the reference voltage Vr, which is established by the source to drain voltage of the second MOS transistor 22. Thus, the voltages which are to be compared have the same temperature coefficient. Thus, the temperature coefficients compensate each other, and the sensing accuracy is improved over a range of temperatures.

As shown in FIG. 3(b), the activation of the transistor 22 is delayed by Td due to the delay means 26. Thus, the transient period illustrated by circle A is excluded from the sensing. Therefore, even if there exists a time lag between the activation of the transistor 21 and the transfer of the voltage V1 to the collector electrode of the transistor 43, erroneous sensing can be prevented.

Furthermore, in this embodiment, the source to drain voltage of the transistor 21 is only supplied to the sensing means 27 when the transistor 41 is in the ON state. Thus, only a relatively low voltage is supplied to the sensing means 27. Therefore, it is possible to prevent a high voltage supply to the sensing means 27, and thus to prevent destruction due to a high voltage supply.

Figure 4:
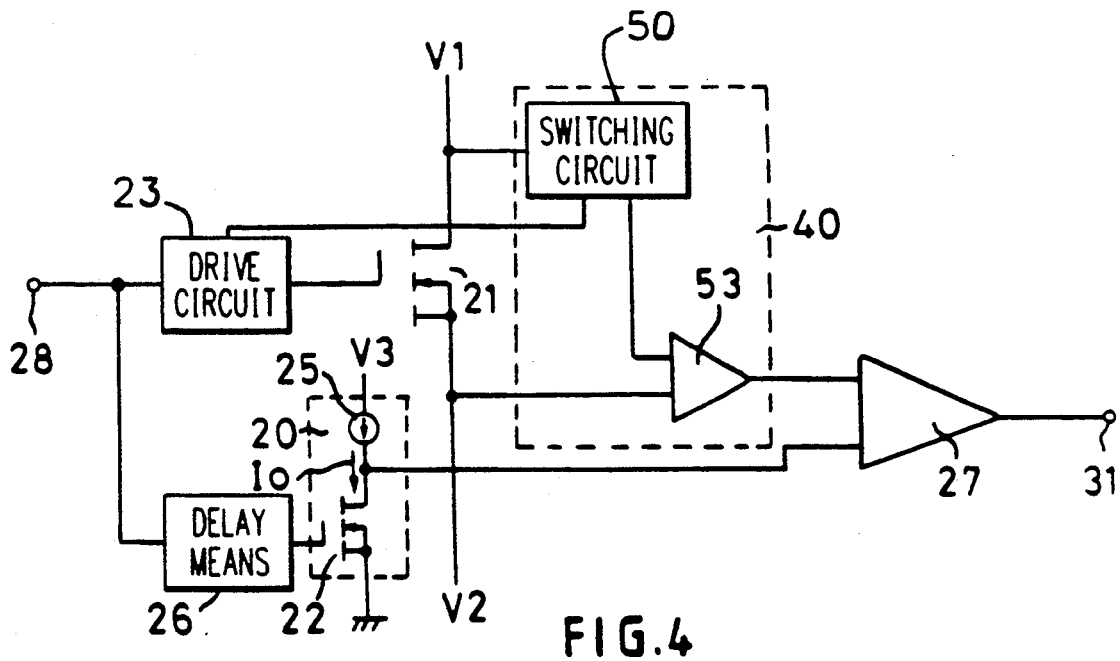
FIG. 4 is a circuit diagram of a second embodiment of the present invention.

FIG. 4 is a circuit diagram of a second embodiment of the present invention. In this embodiment, there is provided first circuit means 40 which produces an output voltage which is proportional to the source to drain voltage of the first MOS transistor 21.

The first circuit means 40 includes a switching circuit 50 and an amplifier circuit 53. The switching circuit 50 is supplied with an output signal from the drive circuit 23 and is controlled by the signal. The amplifier circuit 53 is supplied with the output of the switching circuit 50 and the source voltage of the transistor 21.

In this circuit, when an input signal is supplied to the input terminal 28, the drive circuit 23 produces a drive signal to the gate electrode of the transistor 21 and the switching circuit 50. In response to the drive signal, the switching circuit 50 switches to the ON state, and transfers the drain voltage of the MOS transistor 21 to the amplifier circuit 53.

Therefore, the input voltage to the amplifier circuit 53 is substantially equal to the source to drain voltage of the transistor 21, and the amplifier circuit 53 produces an output which is proportional to the source to drain voltage of the MOS transistor 21. The output of the amplifier circuit 53 is compared with the reference voltage Vr from the reference voltage generating means 20 by the comparing means 27.

Figure 5:
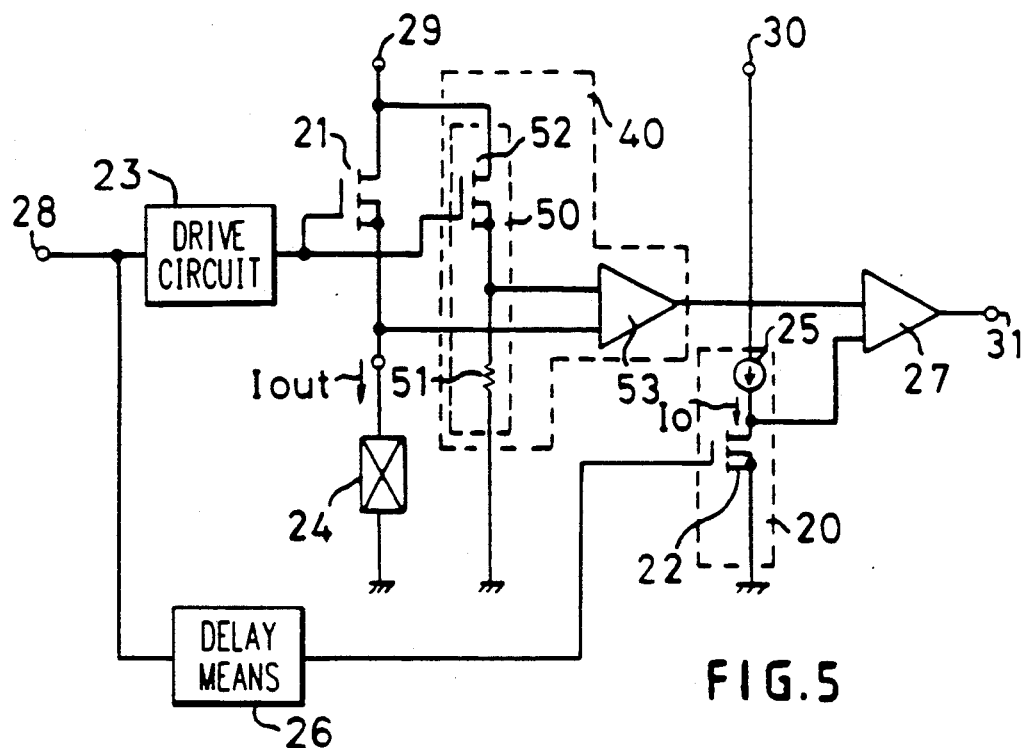
FIG. 5 is a circuit diagram of a third embodiment of the present invention.

FIG. 5 is a circuit diagram of a third embodiment of the present invention. In this circuit, the switching circuit 50 in FIG. 4 is illustrated concretely.

Namely, the switching circuit 50 includes a MOS transistor 52 and a resistor 51. The gate electrode of the transistor 52 is connected to the output of the drive circuit 23, and the source electrode thereof is connected to the input of the amplifier circuit 53.

In this circuit, the transistor 52 switches to the ON state in response to an output signal from the drive circuit 23. By setting the ON resistance of the transistor 52 to be negligible with respect to the resistance value of the resistor 51, the source voltage of the transistor 52 is substantially equal to the drain voltage of the transistor 21. Thus, the input voltage to the amplifier circuit 53 is substantially equal to the source to drain voltage of the transistor 21. Therefore, the output of the amplifier 53 is proportional to the source to drain voltage of the MOS transistor 21. Thus, by comparing the output of the amplifier circuit 53 with the reference voltage, it is possible to sense the load current Iout.

Figure 6:
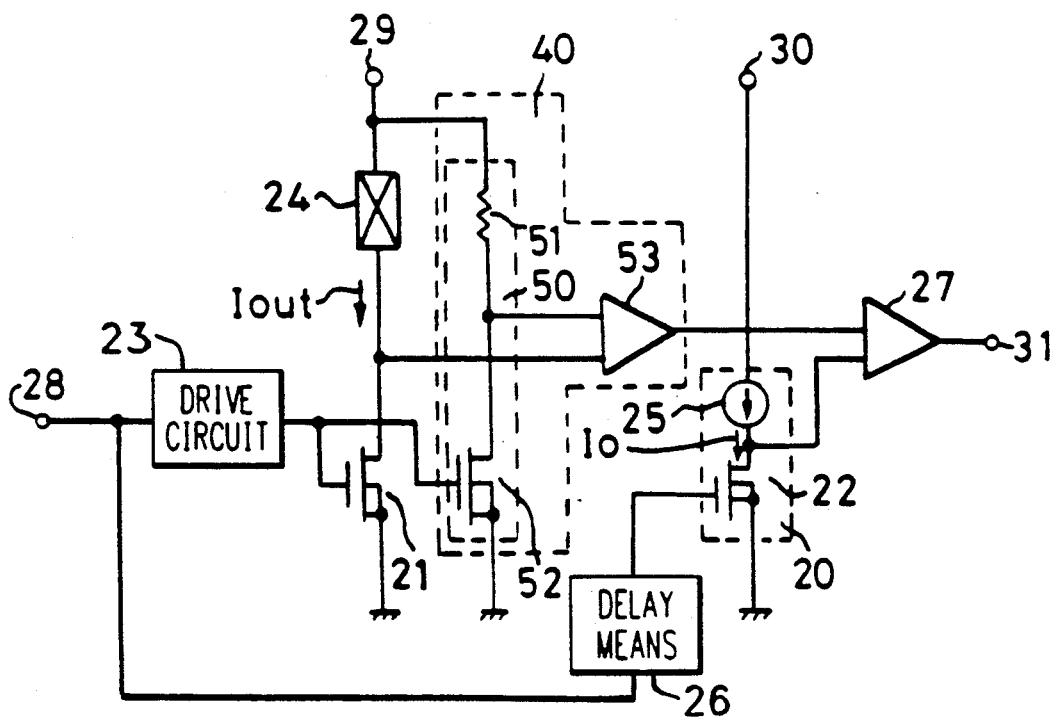
FIG. 6 is a circuit diagram of a fourth embodiment of the present invention.

FIG. 6 is a circuit diagram of a fourth embodiment of the present invention. In this embodiment, the location of the load 24 and the MOS transistor 21 in FIG. 5 is changed with respect to the power supply. Namely, the drain electrode of the transistor 21 is connected to the load 24, and the source electrode thereof is connected to the ground. The gate electrode of the transistor 52 is connected to the gate electrode of the transistor 21, and the drain electrode thereof is connected to the power supply terminal 29 through a resistor 51.

The input terminals of the amplifier circuit 53 are supplied with the drain voltages of the MOS transistors 21 and 52. Assuming that the source to drain voltage of the transistor 52 is negligible, the input to the amplifier circuit 53 is substantially equal to the source of drain voltage of the transistor 21. Thus, similarly to the third embodiment in FIG. 5, the amplifier circuit 53 outputs an voltage which is proportional to the source to drain voltage of the MOS transistor 21. Thus, by comparing the output of the amplifier circuit 53 and the reference voltage Vr, the load current Iout can be sensed.

In the above mentioned embodiments, a comparator circuit is used as the comparing means 27. However, by using an operational amplifier as the comparing means 27, an analogous detecting of the load current Iout can be achieved. Namely, by converting the output voltage of the operational amplifier to a current using a voltage to current converter circuit (not shown), a concrete value of the load current Iout can be achieved.

The present invention has been described with respect to specific embodiments. However, other embodiments based on the principles of the present invention should be obvious to those of ordinary skill in the art. Such embodiments are intended to be covered by the claims.

What is claimed is:

1. A current sensing circuit for sensing a load current flowing through a load, comprising:
    a first MOS transistor having a gate electrode and having a source-to-drain path connected in series with the load to carry the load current with a corresponding source-to-drain voltage;
    means for supplying an input signal;
    reference voltage generating means including a second MOS transistor and a constant current source serially connected with the source-drain path of the second MOS transistor, for generating a reference voltage;
    means for coupling the input signal to the gate electrodes of said MOS transistors;
    circuit means for producing an output voltage proportional to the source-to-drain voltage of the first MOS transistor; and
    comparing means for comparing the output voltage of the circuit means with the reference voltage to indicate whether the load current is above a predetermined current value corresponding to the reference voltage.

2. The current sensing circuit of claim 1, wherein said coupling means includes means for delaying the input signal, and the second means MOS transistor is supplied with the delayed input signal.

3. The current sensing circuit of claim 1, wherein the circuit means includes a third MOS transistor having a gate electrode connected to the gate electrode of the first MOS transistor and having its source-drain path connected within the circuit means so that the circuit means generates and applies the output voltage to the comparing means in response to the input signal.

4. The current sensing circuit of claim 1, wherein the circuit means includes a third MOS transistor serially connected with a resistor in a circuit branch that is parallel connected to the serially connected load and the first MOS transistor source-to-drain path, and an amplifier circuit having input terminals connected to the source electrodes of the first and the third MOS transistors and having its output supplying the output voltage to the comparing means.

5. The current sensing circuit of claim 1, wherein the circuit means includes a third MOS transistor serially connected with a resistor in a circuit branch that is parallel connected to the serially connected load and the first MOS transistor source-to-drain path, and an amplifier circuit having input terminals connected to the drain electrodes of the first and the third MOS transistor and having its output supplying the output voltage to the comparing means.

* * * * *